United States Patent [19]

Wilson et al.

[11] Patent Number: 4,538,867
[45] Date of Patent: Sep. 3, 1985

[54] SOCKET ASSEMBLY CONNECTOR FOR AN ELECTRICAL COMPONENT

[75] Inventors: Albert H. Wilson, Los Angeles; Amir-Akbar Sadigh-Behzadi, Van Nuys, both of Calif.

[73] Assignee: Thomas & Betts Corporation, Raritan, N.J.

[21] Appl. No.: 581,381

[22] Filed: Feb. 17, 1984

[51] Int. Cl.³ .............................................. H01R 23/72
[52] U.S. Cl. .............................. 339/17 CF; 339/17 LC
[58] Field of Search ............. 339/17 R, 17 CF, 17 L, 339/17 LC, 17 LM, 17 M, 17 N, 147 R, 147 P; 361/392–395, 399

[56] References Cited

U.S. PATENT DOCUMENTS

| | | | |
|---|---|---|---|
| 2,189,874 | 2/1940 | Ziganke | 250/27.5 |
| 2,846,672 | 8/1958 | Hennessey | 339/17 CF |
| 3,069,598 | 12/1962 | Daily et al. | 339/17 LM |
| 3,524,198 | 8/1970 | Malmstadt et al. | 339/17 N |
| 3,777,221 | 12/1973 | Tatusko et al. | 361/401 |
| 3,880,493 | 4/1975 | Lockhart, Jr. | 339/147 R |
| 3,912,984 | 10/1975 | Lockhart, Jr. et al. | 339/17 CF |
| 3,966,290 | 6/1976 | Little et al. | 339/17 LC |
| 4,356,532 | 10/1982 | Donaher et al. | 361/393 |
| 4,368,939 | 1/1983 | Foederer | 339/59 |
| 4,380,360 | 4/1983 | Parmer et al. | 339/17 CF |
| 4,397,513 | 8/1983 | Clark et al. | 339/91 |
| 4,464,832 | 8/1984 | Asick et al. | 339/17 CF |

FOREIGN PATENT DOCUMENTS 1554841 12/1967 France .......................... 339/17 LC

OTHER PUBLICATIONS

IBM Bulletin, Byrnes et al, vol. 6, No. 7, pp. 14–15, 12-1963.

Primary Examiner—Neil Abrams
Attorney, Agent, or Firm—Robert M. Rodrick; Salvatore J. Abbruzzese

[57] ABSTRACT

An electronic package is disclosed including a socket assembly for connecting an electronic component to a circuit board. A header is secured to the circuit board, and receives the socket assembly which is connected to the header along a direction parallel to the plane of the circuit board. The socket assembly includes a housing and tray. The tray which accommodates the electronic component, is slidably inserted into the housing.

17 Claims, 7 Drawing Figures

SOCKET ASSEMBLY CONNECTOR FOR AN ELECTRICAL COMPONENT

FIELD OF THE INVENTION

The invention relates generally to a socket assembly for connecting an electronic component to a circuit board and more particularly to a socket assembly used in conjunction with a connector header for providing removable connection of an integrated circuit to a circuit board.

BACKGROUND OF THE INVENTION

In the electronics interconnection industry there is a need to efficiently and economically connect electronic components such as integrated circuits (IC) to printed circuit boards or similar component receiving boards. The integrated circuits are typically supported in a connector apparatus which can be easily inserted or removed from the circuit board without disturbing the remaining components on the board. The connector apparatus should also protect the integrated circuit from adverse handling conditions occasioned by replacement of components. These adverse conditions can both structurally and electrically damage the integrated circuit, rendering the component useless. Structural damage may be caused by rough or accidental mishandling of the fragile integrated circuit and electrical damage may be caused by the static electricity discharged by the handler.

Connector assemblies which are insertable and removable from circuit boards are known. These connectors employ a socket which accommodates the integrated circuit. The socket is inserted into a mating header which is mechanically and electrically secured to the circuit board. Typically the socket including the integrated circuit is inserted in a vertical orientation, that is the socket is brought down onto the header in a direction perpendicular to the plane of the circuit board. While this technique adequately provides for installation and removal without disturbing adjacent connections, clearance must be provided above the socket to allow for such vertical insertion and removal. Thus, when arranging plural circuit boards in parallel fashion, sufficient space must be provided between each to permit such clearance. Accordingly, the circuit boards cannot be placed in as close proximity as would be desirable for efficient use of the available space. Examples of the vertical insertion connectors are shown in U.S. Pat. No. 3,880,493 issued Apr. 29, 1975 and U.S. Pat. No. 4,356,532 issued Oct. 26, 1982, the latter assigned to the assignee of the present invention. In each of these references the connector assembly is secured to the circuit board from above. In addition, the sockets of these connector assemblies include an open upper end which receives the integrated circuit. The integrated circuit remains exposed, both before and after connection to the circuit board and thus is subject to the external adverse conditions of handling.

The electronics industry has also seen the use of socket assemblies which provide for insertion and removal of an integrated circuit along a direction parallel to the plane of the circuit board. One such assembly is shown in U.S. Pat. No. 4,380,360 issued Apr. 19, 1983. In such assemblies, an integrated circuit holder is mechanically and electrically, permanently secured to a circuit board. The holder has a side opening which permits slidable receipt of an integrated circuit cartridge, in a direction parallel to the plane of the circuit board. While avoiding the need for increased space between circuit boards, the replaceable cartridge has an open side end which permits insertion of the integrated circuit into the cartridge. The integrated circuit is not fully enclosed until the removable cartridge is inserted into the fixed holder. Thus, the integrated circuit remains exposed and unprotected in the replaceable cartridge until the cartridge is inserted into the holder. As the holder is fixedly secured to the board there is no provision for the connection of an enclosed integrated circuit to a circuit board.

SUMMARY OF THE INVENTION

It is an object of the present invention to provide a socket assembly for interconnecting an integrated circuit to a circuit board.

It is a more particular object of the invention to provide an apparatus which allows for connection of an enclosed socket assembly containing an integrated circuit to a header attached to a circuit board.

In the efficient attainment of these and other objects the present invention looks towards providing a socket assembly which receives an integrated circuit and can be removably attached to a header secured to a circuit board. The socket assembly can be mounted in a direction parallel to the plane of the circuit board to allow a plurality of boards to be arranged in close spacial relationship without interfering with the insertion and removal of the integrated circuit.

In the particularly described embodiment shown herein, a socket assembly is provided which includes a housing having a channel therein which slidably receives an integrated circuit tray. The socket assembly, comprising the housing and tray which accommodates the integrated circuit, is slidably connected to a header secured to a circuit board. The socket assembly is moved in a direction parallel to the plane of the circuit board.

The integrated circuit tray is loaded with the integrated circuit prior to insertion into the housing, in a direction transverse to the direction of insertion of the tray into the housing.

DETAILED DESCRIPTION OF THE PREFERRED EMBODIMENTS

Figure 1:
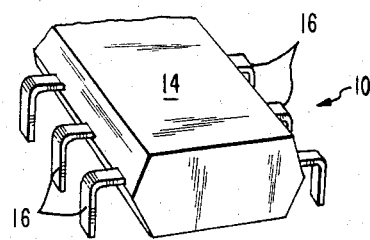
FIG. 1 is a front perspective showing of a portion of a typical integrated circuit used in the assembly of the present invention.
Figure 2:
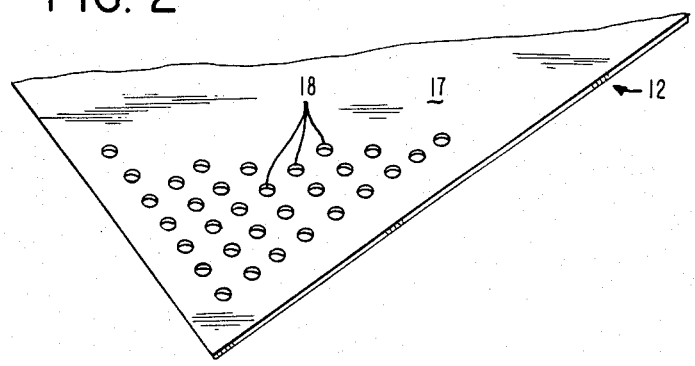
FIG. 2 is a top view of a portion of a typical printed circuit board used in accordance with the present invention.

The present invention provides for interconnection between an electrical component such as integrated circuit 10, FIG. 1, and a circuit board 12, FIG. 2. Integrated circuit 10 is a conventional dual-in-line package (DIP) element, including a semi-conductive, elongate body 14 and a plurality of spaced leads 16 extending from each longitudinal side thereof. Leads 16 are provided for interconnection of the active device contained in body 14 and circuit board 12. Circuit board 12 which may be a printed circuit board or similar member, is also of conventional construction, having a planar insulative body 17 and a plurality of holes 18 patterned thereon. Holes 18 facilitate connection of the integrated circuit 10 to circuit board 12 as will be described hereinafter.

Figure 3:
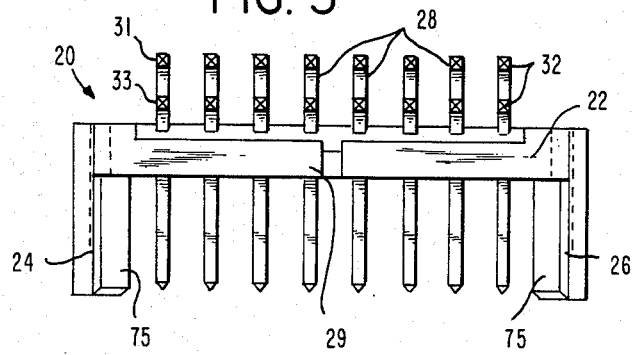
FIGS. 3 and 4 are respectively, front and side plan views of the header of the present invention.
Figure 4:
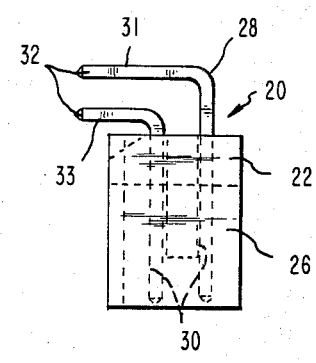

Referring now to FIGS. 2 and 3, a header 20, used in combination with the present invention is shown. Header 20 includes an elongate insulative body 22 which is typically formed of a suitable plastic such as glass or mineral filled polyethylene sulfide. Header body 22 includes a pair of legs 24 and 26 extending from each longitudinal end thereof. Legs 24 and 26 serve as latches to facilitate interconnection of the header 20 as will be described hereinafter. Header 20 further includes a plurality of spaced electrical contacts 28 supported in and extending through a central portion 29 of header body 22. Contacts 28 are pin-type contacts each having a first extent 30 which extends exteriorily of body 22 between legs 24 and 26, and a second extend 32 which is disposed at a right angle to first extent 30. The contacts 28 are positioned in two rows in header 20, the contacts 28 of one row being smaller than the contacts of the other row. Thus, as shown in FIG. 3, one row of contact second extents 31 will be above the other row of contact second extents 33.

Figure 7:
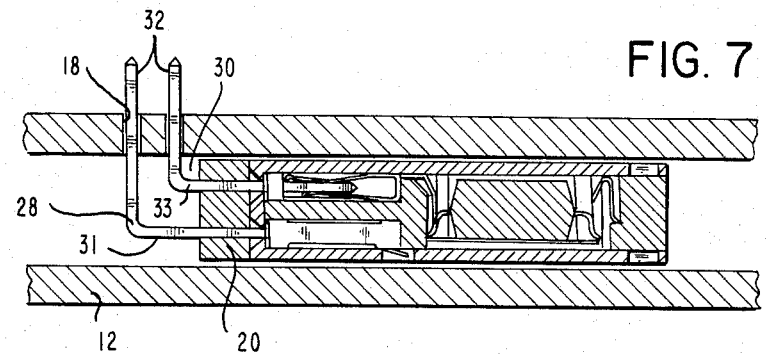
FIG. 7 shows a vertical section of the combination socket assembly and header, attached between a pair of spaced printed circuit boards.

Referring briefly to FIG. 7, header 20 is mounted to circuit board 12 with contact second extents 32 extending through the holes 18 thereof. The contact second extends 32 may be spot soldered or conventionally mechanically and electrically secured to circuit board 12 adjacent the holes 18. By securing the contact second extents 32 to circuit board 12, the header 20 will be fixedly positioned thereon. As above-described, contact first extents 30 of header 20 will extend at right angles to contact second extents 32 and thus extend parallel to the plane of circuit board 12. The lower row 33 of contact second extents 32 is positioned more proximately to circuit board 12 than the upper row 31.

Figure 5:
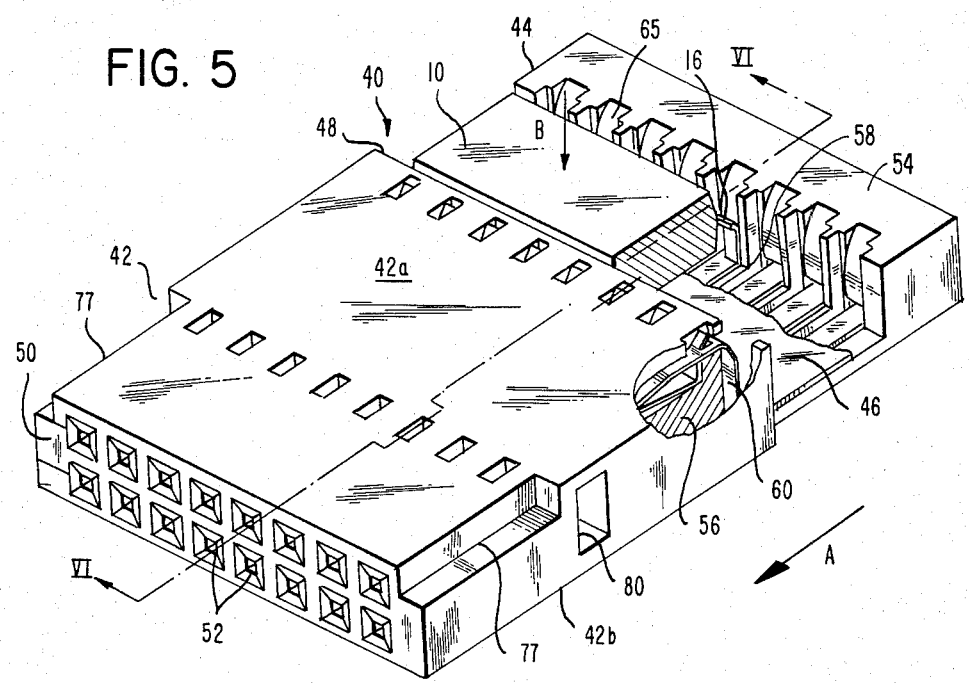
FIG. 5 is a perspective showing of the socket assembly of the present invention including the integrated circuit of FIG. 1.
Figure 6:
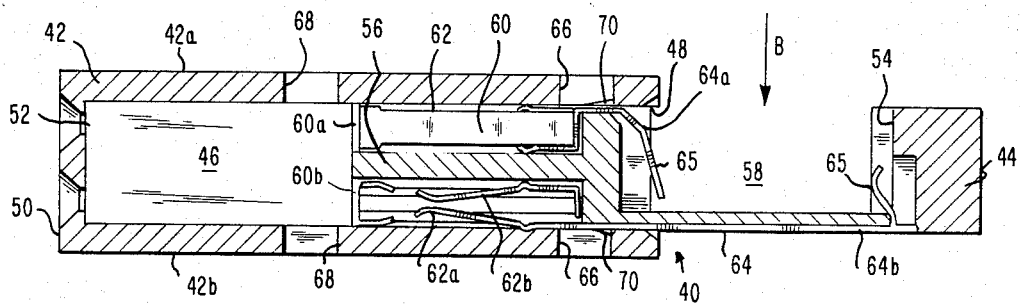
FIG. 6 is a partial sectional showing of the socket assembly of FIG. 5 taken through the lines VI—VI; an alternate contact configuration is shown therein.

With reference to FIGS. 5 and 6, a socket assembly 40 of the present invention may be described. Socket assembly 40 is a two-piece member comprising a housing 42 and tray 44, both members being formed of a suitable insulative plastic material such as polyester. Housing 42 is a substantially rectangular member including a pair of opposed planar walls 42a and 42b and defining a central channel 46 therein. Housing 42 has an open front face 48, substantially perpendicular to planar walls 42a and 42b, which provides access to channel 46. Opposite front face 48 is a rear face 50 which includes a plurality of spaced apertures 52 therethrough. Apertures 52 are aligned in two rows and provided for accommodation of the two rows 31 and 33 of contact first extents 30 of header 20 as will be described in further detail hereinbelow.

Tray 44 is constructed for matable slideable insertion into channel 46 of housing 42, the direction of insertion of tray 44 being along the arrow "A". Tray 44 is also substantially rectangular having forward extent 54 for accommodating the integrated circuit 12 and a rear extent 56 for facilitating interconnection. Forward extent 54 includes a cavity 58 which is exteriorly accessible from above, as shown in the drawings of FIGS. 5 and 6. Cavity 58 receives and supports the integrated circuit 10. Thus, the integrated circuit 10 is inserted in tray 44 in a direction along arrow "B"; that direction being perpendicular to the direction of insertion of tray 44 (arrow "A").

Rear extent 56 supports therein a plurality of electrical terminals 60, positioned for connection with integrated circuit 10. Terminals 60 are elongate members each including a socket 62 at one end thereof and a tail 64 extending oppositely from socket 62. The terminals 60 are arranged in two rows in tray 44 for alignment with the two rows of apertures 52 of housing 42. Sockets 62 of terminals 60 are of conventional design including a pair of spring biased inwardly directed legs 62a and 62b which frictionally accommodate the pin-type second extents 32 of contacts 28 of header 20. Tails 64 extend from the sockets 62 and into the cavity 58 of forward extent 54. As oriented in FIGS. 5 and 6, the upper row 60a of terminals 60 include tails 64a which extend into cavity 58 and are positioned along one side thereof, that side being adjacent sockets 62. The lower row 60b of terminals 60 have tails 64b which extend along the lower surface 44a of tray 44 to the opposite side of cavity 58. Both of tails 64a and 64b have cantilevered end extents 65 which extend into cavity 58. Cantilevered end extents 65 can be of any conventional design, including a dual beam extent as shown in FIGS. 5 and 7 or an alternate single beam extent as shown in FIG. 6.

As shown in FIG. 5, the integrated circuit 10 is inserted into cavity 58 along the direction of arrow "B". The opposed leads 16 are placed in electrical engagement with the cantilevered end extents 65 of terminals 60, thus placing the integrated circuit 10 in electrical contact with the terminals 60. In order to assure proper electrical engagement the leads 16 may be vapor phase soldered or otherwise suitably secured to the cantilevered end extents 65 of terminals 60. As further described hereinbelow, inasmuch as the integrated circuit 10 is fully enclosed by socket assembly 40, upon insertion of tray 44 into housing 42, more effectively interfaces between the leads 16 and end extents 65 may be provided. For example, interfaces such as gold-to-gold may be employed in an enclosed connection where not feasible in exposed connections.

As above mentioned, tray 44 is slidably insertable into channel 46 of housing 42 along the direction of arrow "A". To assure proper engagement of housing 42 with tray 44, housing 42 includes two rows of windows 66 and 68 across each of the planar walls 42a and 42b. The first row of windows 66 is adjacent open face 48 and the second row of windows 68 is more rearwardly disposed. Engageable with each of windows 66 and 68 are spring extents 70 of terminals 60. Each of the spring extents 70 of terminals 60 takes the form of a tang which is struck and bent away from a portion of socket 62. As the tray 44 is inserted in housing 42, the spring extent 70 of each terminal 60 will deflect inwardly to permit passage of tray 44. Once the spring extent 70 is aligned with window 66, it will spring outwardly into window 66 to lock the tray 44 in position. The inclined position of spring extent 70 will permit further inward progression of tray 44 but will prohibit withdrawal thereof. The engagement of the spring extents 70 with windows 66 provides a pre-latched position to allow access to cavity 58 for insertion of the integrated circuit 10, yet prevents the tray 44 from falling out from the housing 42. As the tray 44 is further inserted into channel 46 of housing 42, the spring extent 70 will again deflect inwardly permitting such further insertion. Upon engagement with the second row of windows 68 the spring extents will spring outwardly and engage the windows 68. This will lock the tray 44 in closed position in housing 42. In this position, sockets 62 of terminals 60 will be adjacent to and aligned with apertures 52 of housing 42 (FIG. 7) and provide connection access for the contacts 32 of header 20. The tray 44 is locked into the channel 48 of housing 42, with integrated circuit 10 being electrically connected to terminals 60. The socket assembly 40 provides a full enclosure for integrated circuit 10, permitting handling of the socket assembly 40 without adversely effecting, either mechanically or electrically, the integrated circuit 10 housed therein.

Referring to FIG. 7, the insertion of the socket assembly 40 including the integrated circuit 10 may be described. The socket assembly 40, as above-described includes integrated circuit 10 loaded into tray 44 and the tray 44 inserted and locked into housing 42. Also, as above-described header 20 is secured to the circuit board 12. The socket assembly 40 is moved along one surface of circuit board 12 in a direction parallel thereto. As no vertical displacement (relative to circuit board 12) is needed for insertion, the socket assembly 40 may be inserted between two closely spaced circuit boards 12 and 13. As socket assembly 40 is inserted into header 20, the second extents 32 of contact 28 are received in sockets 62, providing electrical connection therebetween. A conventional cooperative locking mechanism on the header legs 24 and 26 and the housing 42, locks the socket assembly 40 onto the header 20.

In order to assure proper orientation of the socket assembly 40 with respect to header 20, polarization means is provided. In the preferred embodiment, the polarization means takes the form of a key 75 (FIG. 3) on each of legs 24 and 26 which engages a key-way 77 on either side of housing 42 (FIG. 5). This key and key-way arrangement prevents inverted insertion of socket assembly 40.

In repairing or replacing the integrated circuit 10 it may become necessary to remove the socket assembly 40 from header 20, without distributing the arrangement of circuit boards 12 and 13 or adjacent connections. Thus, a pair of opposed slots 80 are provided on opposite sides of housing 42 (FIG. 5). Slots 80 permit engagement of a insertion/removal tool (not shown) which facilitates removal of socket assembly 40. The insertion/removal tool is typically a finger-type tool which can be inserted between the spaced circuit boards 12 and 13. The fingers of the tool engage slots 80 on each side of housing 42.

Various other changes to the foregoing, specifically disclosed embodiments and practices will be evident to those skilled in the art. Accordingly, the foregoing preferred embodiments are intended in an illustrative and not in a limiting sense. The scope of the invention is set forth in the following claims.

We claim:

1. An electronic package for interconnecting an electronic component comprising:
   a housing defining therein a tray receiving channel, said housing having a first open face in communication with said channel to permit access to said channel and a second face having contact accessing means for providing interconnection access; and
   a tray for receipt of said electronic component, said tray being dimensioned for slidable insertion into said channel, said tray having a first extent including thereon a plurality of contacts alignable with said contact accessing means of said housing and a second extent including an exteriorly opening cavity for removable receipt of said electronic component, said contacts on said first extent being electrically engageable with said electronic component, said contacts further having contact extents extending therefrom and said housing includes a plurality of windows aligned in two spaced positions, said contact extents being engageable with the first of said two window positions for supporting said tray in a position wherein said cavity is exterior of said housing and said contact extents being further engageable with the second of said two window positions for supporting said tray in a position wherein said cavity is interior of said housing.

2. A package in accordance with claim 1 wherein said electronic component is an integrated circuit having a semi-conductive body and a plurality of leads extending therefrom.

3. An electronic package in accordance with claim 2 wherein said contacts include tail portions extending from said first tray extent to said second tray extent said tail portions being electrically engageable with said leads of said integrated circuit.

4. An electrical interconnection assembly for providing electrical connection between a integrated circuit and a planar circuit board comprising:
   a header having an insulative body and a plurality of electrical contacts extending therethrough, each of said electrical contacts having a first portion for securement to a generally planar printed circuit board and a second portion extending in a first direction parallel to the plane of said printed circuit board; and
   a socket assembly removably securable to said header by movement slidably in said first direction along a surface of said printed circuit board, said socket assembly comprising:
   (a) a housing defining therein a tray receiving channel exteriorly accessible at one face thereof and including electrical contact accessing means at a second face thereof for providing connection access to said second portions of said header electrical contacts;
   (b) a tray for supporting an integrated circuit, said tray being slidably received along said first direction in said channel, said tray including a cavity which opens in a direction perpendicular to said plane of said printed circuit board for removable accommodation of said integrated circuit; and
   (c) a plurality of terminals supported in said tray in electrical engagement with said integrated circuit, said terminals including extents thereof electrically engageable with said second portions of said header contacts upon said movable securement of said socket assembly to said header.

5. An assembly in accordance with claim 4 further comprising polarization means for providing proper orientation between said socket assembly and said header.

6. An assembly in accordance with claim 5 wherein said polarization means includes a key on said header and a key-way on said socket assembly, said key being insertable into said key-way upon securement of said socket assembly to said header.

7. An assembly in accordance with claim 4 wherein said socket assembly includes engagement means for providing removal of said socket assembly from said header.

8. An assembly in accordance with claim 4 wherein said electrical contact second portions extend perpendicularly from said electrical contact first portions.

9. As assembly in accordance with claim 8 wherein said socket assembly is securable to said header between two spaced parallel circuit boards.

10. An electrical connector for connecting an integrated circuit to a header secured to substantially planar circuit board, said header having electrical contact pins therein with contact pin extents extending parallel to the plane of said circuit board, said connector comprising:
- a housing and tray assembly slidably removably attachable to said header in a direction parallel to said plane of said circuit board, said housing and tray assembly further comprising:
  (a) a housing having a channel therein, said channel being accessible exteriorly at one face of said housing, said housing including contact receiving means for removable receipt of said contact pin extents of said header;
  (b) an integrated circuit;
  (c) a tray receiving said integrated circuit, said tray being slidably receivable in said housing cavity through said one face; and
  (d) a plurality of electrical contacts supported in said tray in electrical engagement with said integrated circuit, said contacts having contact portions for disposition adjacent said contact receiving means of said housing, thereby placing said integrated circuit in electrical connection with said header upon slidable attachment of said housing and tray assembly to said header, said contacts further including an extending spring biased tang and wherein said housing includes a pair of windows the first window of said pair being adjacent said one face of said housing and said second window being spaced therefrom, said tang of said contact being engageable with said first window upon said slidable movement of said tray, to maintain said tray in position substantially exterior of said housing cavity and being engageable with said second window to maintain said tray in a position substantially interior of said housing cavity.

11. A connector in accordance with claim 10 wherein said tray is slidably received in said housing along a first direction and when said integrated circuit is received in said tray along a second direction perpendicular to said first direction.

12. A connector in accordance with claim 10 wherein each of said contacts include a socket and a tail, the socket being engageable with the pin extents of said header and said tail being in engagement with said integrated circuit.

13. A connector in accordance with claim 12 wherein said contact receiving means includes a plurality of apertures, each aperture being adjacent said socket of one of said contacts upon insertion of said tray into said housing.

14. An electronic package for accommodating an integrated circuit comprising:
- a housing having a first open face and a central channel therein in communication with said open face, said housing having a second face including connection accessing means for providing electrical connection access;
- a tray for removably accommodating said integrated circuit, said tray being insertably received in channel of said housing through said first open face by slidable movement in a first direction, said tray having a first extent including a plurality of electrical contacts alignable with said connection accessing means of said housing and a second extent including an exteriorly opening cavity for insertable removable receipt of said integrated circuit, said tray being slidably movable in said housing channel from a first position wherein said tray cavity is exterior said housing to a second position wherein said cavity is interior said housing, said contacts of said first extent being electrically engageable with said integrated circuit upon movement of said tray to said second position.

15. An electronic package of claim 14 wherein said first direction is perpendicular to said second direction.

16. An electronic package of claim 15 wherein said tray cavity is closed upon movement from said first position to said second position.

17. An electronic package of claim 14 wherein said contact includes locking elements for cooperative engagement with said housing for supporting said tray in said first and second positions.

* * * * *